United States Patent
Tseng

(10) Patent No.: US 8,217,317 B2
(45) Date of Patent: Jul. 10, 2012

(54) APPARATUS WITH STRAIN RELEASE FEATURE FOR HIGH TEMPERATURE PROCESSES

(75) Inventor: Michael Tseng, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 965 days.

(21) Appl. No.: 12/207,766

(22) Filed: Sep. 10, 2008

(65) Prior Publication Data

US 2010/0059500 A1    Mar. 11, 2010

(51) Int. Cl.
*H05B 3/68* (2006.01)
*F26B 19/00* (2006.01)

(52) U.S. Cl. ...................... 219/444.1; 392/418

(58) Field of Classification Search .................. 219/390, 219/408, 411, 444.1; 392/416, 418; 118/715, 118/724, 725, 728, 729, 730; 310/90, 90.5
See application file for complete search history.

(56) References Cited

U.S. PATENT DOCUMENTS

| | | | |
|---|---|---|---|
| 5,960,555 A * | 10/1999 | Deaton et al. | ...................... 34/58 |
| 6,157,106 A | 12/2000 | Tietz et al. | |
| 6,468,354 B2 | 10/2002 | Huang et al. | |
| 7,166,168 B1 | 1/2007 | Heller et al. | |
| 7,378,618 B1 * | 5/2008 | Sorabji et al. | .................. 219/411 |

* cited by examiner

*Primary Examiner* — Sang Paik
(74) *Attorney, Agent, or Firm* — Patterson & Sheridan, LLP

(57) ABSTRACT

A method and apparatus for thermally treating a substrate is provided. A thermal treatment chamber has a substrate support and a magnetically permeable rotor housed in a rotor well. An annular cover shields the rotor from the processing environment. The annular cover has a thermal stress relief joint formed therein that provides one or more mechanical degrees of freedom to allow portions of the cover to shift with thermal stresses. In one embodiment, a gap is formed in the annular cover at the point of maximum thermal stress.

20 Claims, 3 Drawing Sheets

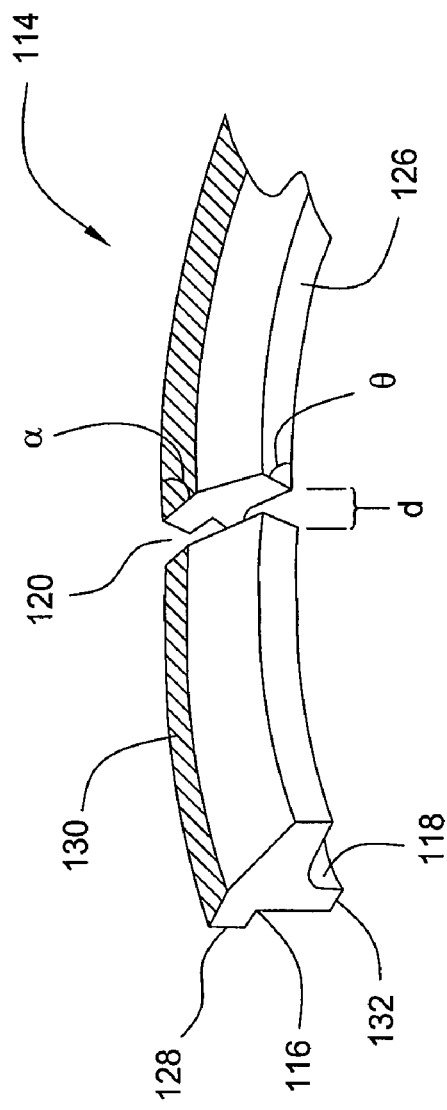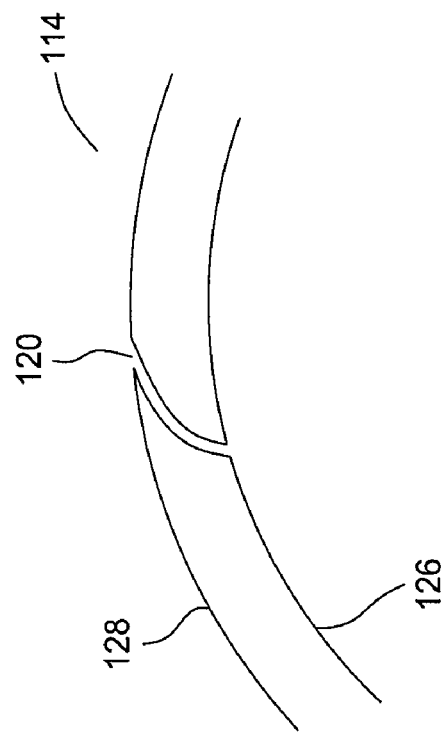

APPARATUS WITH STRAIN RELEASE FEATURE FOR HIGH TEMPERATURE PROCESSES

FIELD

Embodiments of the invention relate to thermal treatment of substrates. More specifically, embodiments of the invention provide apparatus and methods having favorable responses to thermal stresses encountered when thermally treating substrates.

BACKGROUND

Thermal treatment of substrates is a staple of the semiconductor manufacturing industry. Substrates are subjected to thermal treatments in a variety of processes and apparatus for a variety of reasons. In some processes, substrates are subjected to annealing thermal energy, while in others, they may be subjected to oxidizing or degassing conditions. One substrate after another is positioned in an apparatus, heated for processing, and then cooled. The apparatus for thermally processing the substrate may undergo hundreds or thousands of extreme heating and cooling cycles every day.

In addition to thermal treatment of substrates, various aspects of operating the apparatus may require materials with certain electrical, optical, or thermal properties. Design of such apparatus can present formidable engineering challenges to those wishing to prolong the useful life of such apparatus under the extreme conditions to which they are subjected. As pressure builds to reduce cost and increase throughput, more emphasis than ever before is placed on reducing or eliminating facility downtime. Thus, there is a continuing need for apparatus and methods of making apparatus capable of performing reliably under the extreme thermal cycling of modern semiconductor processes.

SUMMARY

Embodiments of the invention generally provide apparatus for thermal treatment of substrates. One set of embodiments provides an apparatus for thermally treating a substrate, comprising a substrate support, a magnetically permeable ring below the substrate support, and an annular cover over the magnetically permeable ring.

Other embodiments provide a rotor cover for a thermal treatment chamber, comprising an annulus having an inner portion and an outer portion, a support ledge formed in the outer portion of the annulus, a shield portion formed in the inner portion of the annulus, and a gap in the annulus.

Other embodiments provide a shield member for a thermal treatment chamber, comprising a ceramic ring-like article with a support ledge formed in an outer portion, a shield extension formed in an inner portion, and a gap, wherein the gap is a vertical opening in the ceramic ring-like article comprising an open space measuring less than about 0.05 inches between two portions of the ceramic ring-like article.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1C is a perspective view of the article of FIG. 1A according to another embodiment of the invention.

FIG. 1D is a top view of the article of FIG. 1A according to another embodiment of the invention.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figures 1A, 1B:
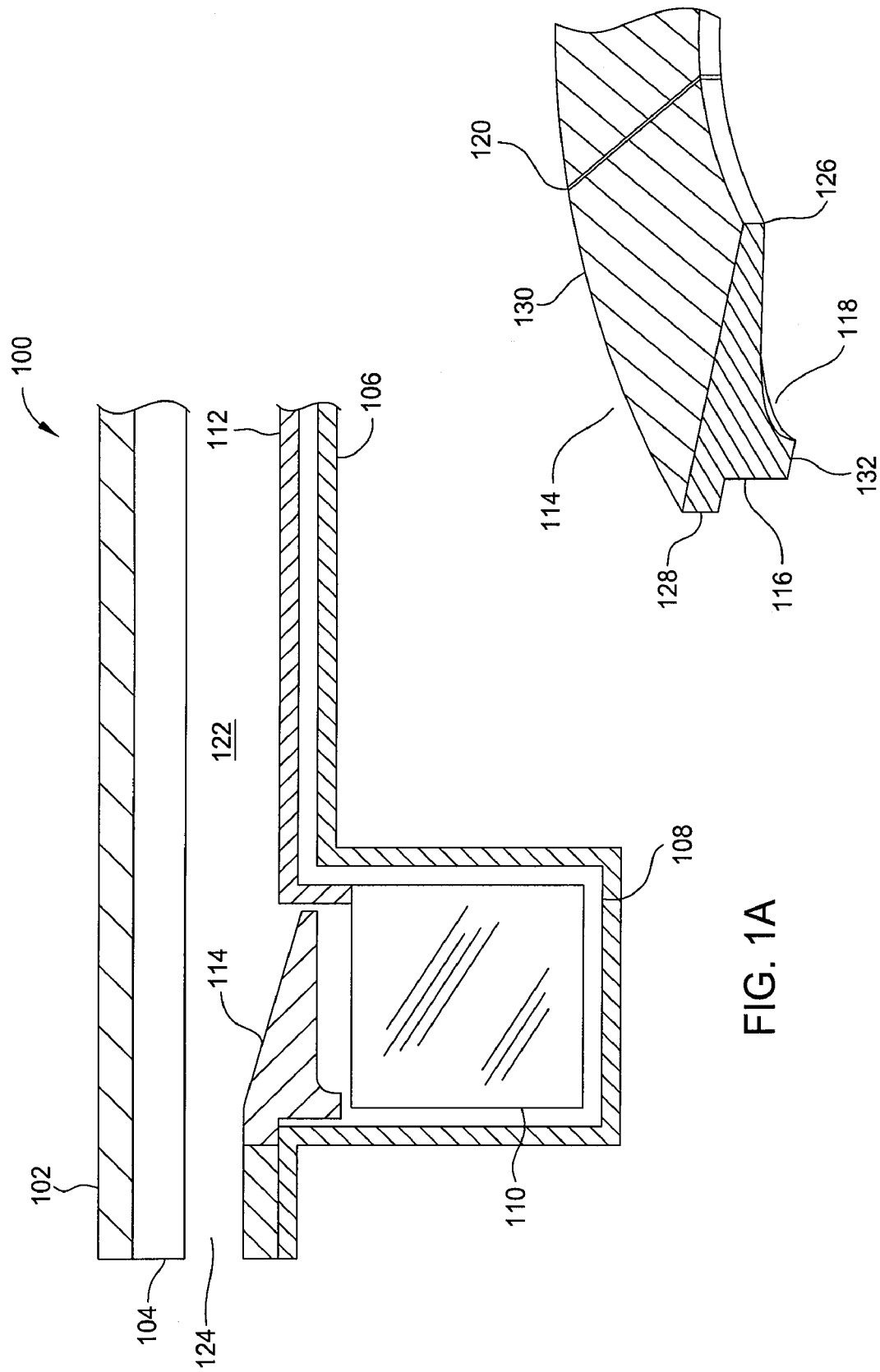
FIG. 1A is a schematic cross-sectional diagram of an apparatus according to one embodiment of the invention.
FIG. 1B is a perspective detail view of an article of the apparatus of FIG. 1A, according to another embodiment of the invention.

Embodiments of the invention generally provide an apparatus and methods for managing thermal stresses in an article undergoing thermal treatment. FIG. 1A is a schematic cross-section of an apparatus according to one embodiment of the invention. FIG. 1A shows a portion of a chamber 100 that may be used for thermal processing of a substrate. The chamber 100 comprises a radiant source 102 disposed to direct electromagnetic energy into the chamber, and a window 104 for admitting energy from the radiant source 102 into the chamber 100. A substrate support 112 is provided for staging a substrate for processing, and the substrate support 112 and the window 104 cooperatively define a processing volume 122. The chamber features one or more openings 124 for inserting a substrate for processing and providing process gases to the chamber, as well as openings (not shown) for removing process gases from the chamber. A chamber wall 106 forms the bottom of the chamber.

Chamber 100 features a rotor well 108 for housing a rotor 110 therein. The rotor 110 supports the substrate support 112 in a position for processing and allows the substrate support to be rotated by magnetically coupling the rotor 110 to an external magnetic actuator (not shown). To protect the rotor 110 from the extreme processing environment generated in the processing volume 122, an annulus 114 is disposed over the rotor 110 to act as a shield. The annulus 114 is a barrier between the rotor well 108, housing the rotor 110, and the processing volume 122.

The radiant source 102, which is also a heat source in most embodiments, may comprise any combination of heat lamps, flash lamps, plasma lamps, arc lamps, lasers, UV lamps, microwave sources, and the like. The radiant source 102 may be a single energy source or a plurality of sources. The window 104 may be quartz, sapphire, or any material selected to transmit a desired quantum of energy from the radiant source 102 into the processing volume 122. In some embodiments, the window may be supplemented with a filter (not shown), which may be a film applied over one or more surfaces of the window 104, for blocking or admitting selected frequencies of electromagnetic radiation. The window 104 will generally be sized and shaped for processing particular substrates. For example, a disk-shaped window 104 may be used for processing circular, or disk-shaped, substrates, while a rectangular window 104 may be used for processing rectangular substrates. The window 104 may also be liquid-cooled or gas-cooled, for example water-cooled, in some embodiments, by virtue of channels formed through portions of the window 104.

The substrate support 112 generally comprises any material capable of withstanding the processing environment of the thermal chamber. In some embodiments, the substrate support 112 may be ceramic, and in other embodiments it may be a metal, such as aluminum, or an alloy. Some embodiments may require that the substrate support 112 have certain electrical, thermal, or optical properties. In some embodiments, the substrate may be electrically bound to the substrate support 112, so the substrate support 112 will be electrically conductive. In some embodiments, the substrate support 112 may reflect electromagnetic energy. Some embodiments may feature a coating on the substrate support 112 to protect it from the processing environment. In FIG. 1A, the substrate support is shown as a solid member underlying the entire substrate, but in some embodiments, the substrate support 112 may be a ring or annular support member that contacts only the edge of the substrate. In other embodiments, the substrate support 112 may be perforated, or may be a mesh-type material.

The rotor 110 is a magnetically permeable member that rotates under the influence of an external magnetic actuator. The rotor 110 thus comprises a magnetically permeable material such as an iron-containing material. Most varieties of steel may be used for the rotor 110, for example. The rotor 110 may be a permanent magnet, or it may be an impermanent magnet. The rotor 110 may also be a ring or ring-like article.

Because the rotor 110 usually comprises a material sensitive to thermal conditions, such as most iron-containing materials, and because the rotor must remain magnetically permeable, the rotor is shielded from the environment of the processing volume 122 by a shield member 114. The shield member 114 is depicted in more detail in FIGS. 1B-1D. The shield member 114, which may be a rotor cover, is an annulus with an inner portion 126 extending over the rotor 110 and toward the substrate support 112, and an outer portion 128 that impinges the chamber wall 106. The shield member 114, which may be a ring in some embodiments or an annular cover in other embodiments, has a support ledge 116 formed in the outer portion 128, and a shield portion 118 formed in the inner portion 126 that extends over the rotor well 108 toward the substrate support 112, substantially covering the rotor well 108 and shielding the rotor 110 from the conditions of the processing volume 122. In some embodiments, the shield portion 118 may be a shield extension.

The shield member 114 generally comprises a material capable of withstanding the processing conditions of the thermal chamber without undergoing chemical change such as oxidation. A ceramic material will generally be useful under such conditions. The shield member 114 may thus comprise a ceramic material such as a metal oxide or metal carbide, for example alumina.

The shield member 114 has a gap 120 formed therein. The gap 120 is depicted in the perspective and top detail views of FIGS. 1B-1D. The gap 120 provides thermal stress relief for the shield member 114. When positioned in the area receiving the most thermal stress, the gap 120 in the shield member 114 is a stress relief joint, providing a mechanical degree of freedom to absorb the stress.

As shown in FIG. 1B, the gap 120 may be a vertical cross-section through the shield member 114. The gap 120 in the embodiment of FIG. 1B is perpendicular to a plane formed by the uppermost surface 130 of the shield member 114 and to a plane formed by the lowermost surface 132 of the shield member 114. The gap 120 in the embodiment of FIG. 1B is oriented along a radius of the circle formed by the inner portion 126 of the shield member 114 and to a circle formed by the outer portion 128 of the shield member 114. The gap 120 in this embodiment is a generally linear feature in that the surfaces of the shield member 114 on either side of the gap 120 are substantially flat and parallel. In this embodiment, a line drawn between the surfaces of the shield member 114 on either side of the gap 120, and parallel to the plane formed by the uppermost surface 130 or lowermost surface 132, would intersect the circles formed by the inner and outer portions, 126 and 128 respectively, and would be perpendicular thereto. It is naturally understood that a linear feature is "perpendicular" to a circle if it is perpendicular to a tangent of the circle at the point of intersection between the linear feature and the circle.

FIG. 1C illustrates another embodiment, in which the gap 120 is a straight cross-section through the shield member 114, forming oblique angles with the reference loci. The gap 120 of FIG. 1C forms an angle $\alpha$ with the circle formed by the inner portion 126 of the shield member 114, and an angle $\theta$ with the lowermost surface 132. Each of the angles $\alpha$ and $\theta$ in FIG. 1C may range from about 20° to 160°. In some embodiments, an oblique gap such as that depicted in FIG. 1C may be useful to provide thermal stress relief to the shield member 114 while reducing the opportunity for process conditions from the processing volume 122 to expand through the gap 120 and impinge on the rotor 110.

FIG. 1D illustrates another embodiment in which the gap 120 is a curved cross-section through the shield member 114. In the embodiment of FIG. 1D, the gap curves from the outer portion 128 to the inner portion 126 of the shield member 114. Additionally, the gap may have a curved profile from the uppermost surface 130 to the lowermost surface 132. Other embodiments not shown may include gaps that turn corners partway through. For example, a gap may be perpendicular to the inner portion 126 of the shield member, but form an oblique angle with the outer portion 128, with a sharp angle in the gap profile. Other embodiments may combine curvature, obliquity, and discontinuity in any convenient manner. Still other embodiments may feature gaps having an extension on one surface that mates with a recess on another surface, such as a mortis and tenon joint. Gaps featuring high degrees of obliquity or curvature may have bounding surfaces that are large in area compared to the width of the gap. Large area surfaces with small gap widths may be useful in preventing process gases and conditions from traveling through the gap 120 to impinge the rotor 110 by providing large surfaces for heat dissipation and fluid friction between process gases and the gap surfaces.

The gap 120 of FIG. 1C has a width d that may be selected to meet specific criteria. In some embodiments, the width d may be selected such that portions of the shield member comprising the surfaces bounding the gap 120 on either side are separated by open space at ambient conditions, but touch when the shield member is heated to processing conditions. If the shield member is a ceramic material, its coefficient of thermal expansion will be small, so the width d will also be small. For an alumina shield member, the gap 120 at room temperature may have a width d less than about 0.05 inches. Thus, in some embodiments, the gap may be no more than a slice through the shield member 114. At a microscopic level, the width d of the gap 120 will vary. The surfaces bounding the gap 120 may touch at some locations while being separated by open space at other locations. In some embodiments, the surfaces may touch at room temperature but be separated by open space at processing temperatures.

In some embodiments, designed roughness of the surfaces bounding the gap 120 may be useful. A shield member such as the shield member 114 may be formed with a gap 120, for example by using a molding process that creates a gap. The surfaces bounding the gap may be formed with a desired level of roughness by using a mold with the requisite roughness. Alternately, the gap may be formed by cutting through the shield member 114, and roughness imparted by abrasion. Further, roughness may be imparted by cutting through the shield member 114 in a microscopically tortuous manner, thus creating a gap with rough walls. Increased roughness may help prevent leakage of process gases through the gap and prevent process conditions from affecting the rotor well 108 or rotor 110.

In some embodiments, an annular shield member may comprise two pieces, each providing about half the circumference of the annular shield member. The annular shield member may be similar in all respects to the shield member 114, rendered in two substantially identical semi-annular pieces. When deployed, the gaps between the two pieces, which may be similar to any of the gaps described above, allow portions subjected to thermal stresses to move with respect to one another. In some embodiments, the gaps between the pieces may be the same or different. The annular shield member may thus define a first gap of a first type and a second gap of a second type. The gaps will generally be located along a diameter of the complete annular shield member.

Some embodiments feature a shield member having constrained movement elements, such as flexible portions or hinged portions. An annular member such as shield member 114 may be provided with a flexible portion to allow constrained movement when thermal energy is applied. The degrees of freedom provided by the flexible portion prevent stress from building up in the annular member. Likewise, providing hinged portions may allow freedom of movement to minimize thermal stresses. Generally, two such hinges would be provided, located along a diameter of the annular member. The hinges would allow the two portions of the annular member hinged together to move independently, while still maintaining a positional relationship The rotor cover 114 described herein embodies a method of providing thermal stress relief to an article in a thermal processing apparatus. The method generally comprises identifying portions of the article undergoing maximum thermal stress, and providing one or more mechanical degrees of freedom to relax the stress. The one or more mechanical degrees of freedom may be provided by detaching portions to allow free movement, or by inserting a flexible member to allow constrained movement. Detaching portions may comprise providing a gap in a location that receives thermal stress, so portions near the gap can move with respect to each other.

Figure 2A:
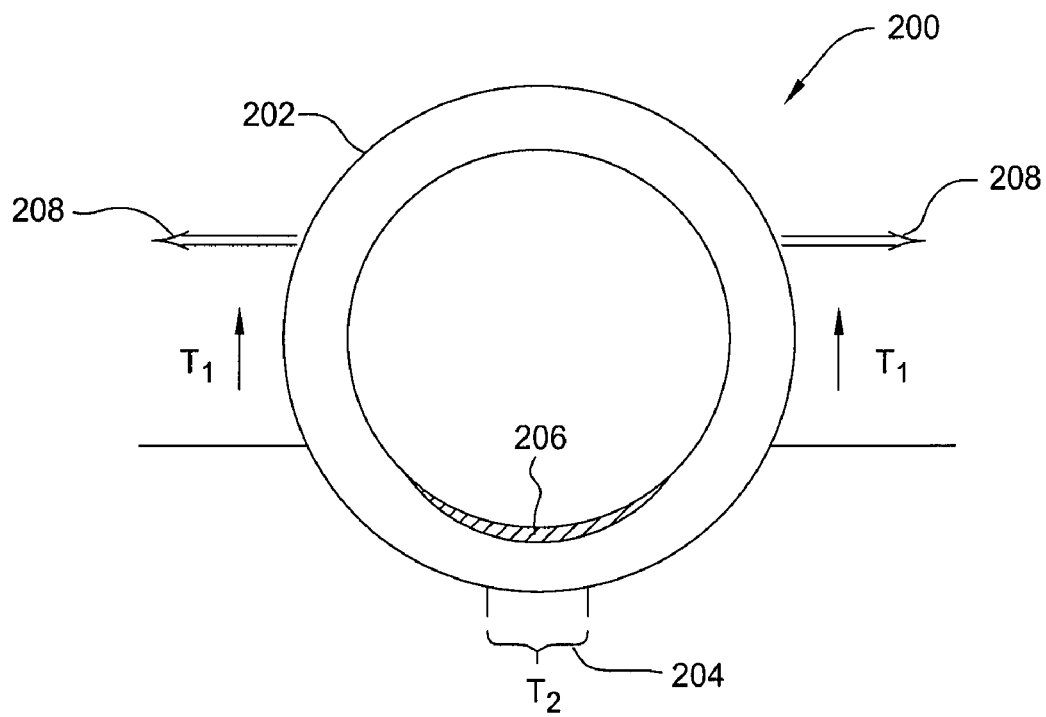
FIG. 2A is a schematic top view of a prior art article showing thermal properties of the article.

FIG. 2A is a top view of a prior art article 200 undergoing thermal stress. A first portion 202 of the article 200 has a temperature $T_1$, and a second portion 204 has a temperature $T_2$. The difference between these two temperatures may cause a tensile force 208 on the article, leading to thermal stress in stress region 206. If this stress is large enough, the article 200 may be damaged in stress region 206.

Figure 2B:
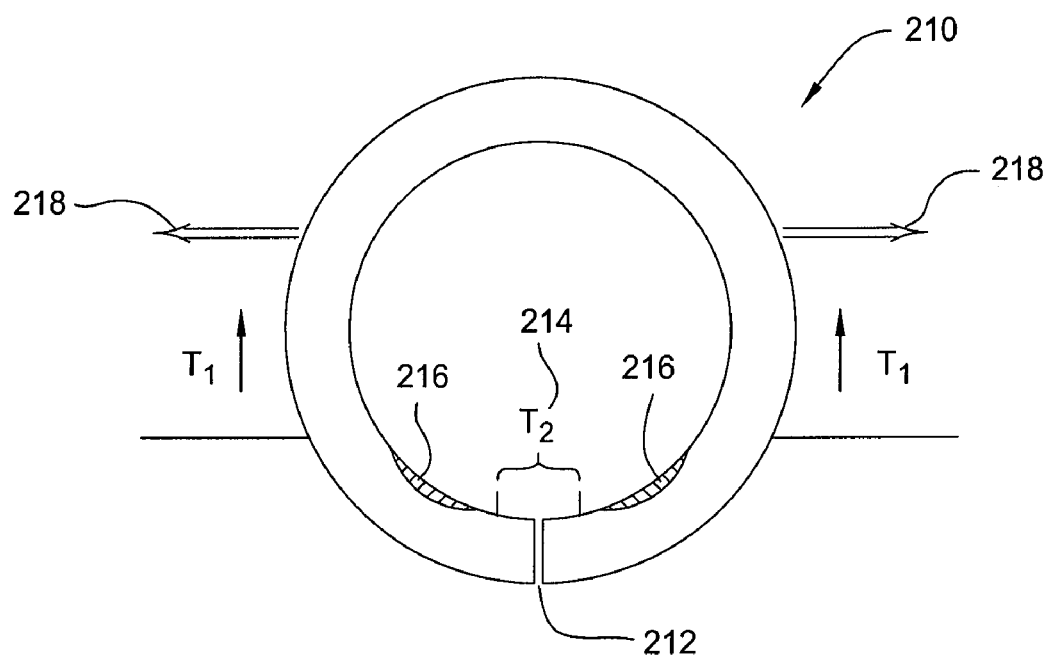
FIG. 2B is a schematic top view of an article according to an embodiment of the invention, showing thermal properties of the article.

FIG. 2B is a top view of an article 210 according to an embodiment of the invention. Similar to the article 200 of FIG. 2A, the article 210 of FIG. 2B is shown undergoing thermal stress due to the difference in temperatures $T_1$ and $T_2$ of different regions of the article 210. The thermal stress gives rise to tensile force 218. The article 210 of FIG. 2B has a stress relief feature 212 that provides freedom of movement for portions of the article in stress region 214. Thus, the stress region is reduced to region 216. In the article 210 of FIG. 2B, the stress relief feature is shown as a gap, but any feature that provides degrees of freedom may be used.

If the article is a member with a shielding function, it may be useful to design the size of the gap such that during processing the gap closes due to thermal expansion of the article. In other embodiments, a gap may be provided that has a large surface area relative to its width. Such a gap will provide some shielding function even without fully closing during thermal processing by providing a very long or tortuous pathway for process gases and conditions to travel to reach the areas being shielded. Thus, a highly oblique gap in a ring-like member, such as a linear cut through the ring-like member at a low angle with respect to the plane of the ring-like member, will provide thermal stress relief while reducing or eliminating leakage of the process environment. Additionally, curvature, cornering and roughening may also prevent leakage.

The mechanical relief feature, such as a gap or flexible member, may be designed to adjust with processing conditions. For example, a flexible member may be provided that becomes more flexible as temperature increases and thermal stress builds. Likewise, a gap may be provided that comprises an open space between two portions of the member at ambient conditions, but closes at processing conditions due to thermal expansion, thus sealing the processing volume.

In some embodiments, thermal relief may be provided by adding one or more constrained movement features to the article, such as one or more hinges. Such features will allow movement of portions of the article with respect to one another under thermal influence, thus avoiding buildup of thermal stress.

While the foregoing is directed to embodiments of the invention, other and further embodiments of the invention may be devised without departing from the basic scope thereof.

What is claimed is:

1. A rotor cover for a thermal treatment chamber, comprising:
   an annulus having an inner portion and an outer portion;
   a support ledge formed in the outer portion of the annulus;
   a shield portion formed in the inner portion of the annulus; and
   a gap through the annulus.

2. The rotor cover of claim 1, wherein the gap is straight.

3. The rotor cover of claim 1, wherein the gap is vertical.

4. The rotor cover of claim 1, wherein portions of the annulus on either side of the gap touch.

5. The rotor cover of claim 4, wherein the annulus comprises a ceramic material.

6. The rotor cover of claim 1, wherein the gap is a stress relief joint.

7. A rotor cover for a thermal treatment chamber, comprising:
   an annulus having an inner portion and an outer portion;
   a support ledge formed in the outer portion of the annulus;
   a shield portion formed in the inner portion of the annulus; and
   a gap in the annulus, wherein the gap is a slice through a portion of the annulus.

8. A rotor cover for a thermal treatment chamber, comprising:
   an annulus having an inner portion and an outer portion;
   a support ledge formed in the outer portion of the annulus;
   a shield portion formed in the inner portion of the annulus; and a gap in the annulus, wherein the gap comprises an open space between two portions of the annulus at ambient conditions.

9. The rotor cover of claim 8, wherein the open space measures less than about 0.05 inches at ambient conditions.

10. An apparatus for thermally treating a substrate, comprising:
a substrate support;
a magnetically permeable ring below the substrate support; and
an annular cover over the magnetically permeable ring, wherein the annular cover has a gap through the annular cover.

11. The apparatus of claim 10, wherein the magnetically permeable ring is a rotor, and the annular cover is a rotor cover.

12. The apparatus of claim 10, wherein the annular cover comprises a ceramic material.

13. The apparatus of claim 10, wherein the gap is straight.

14. The apparatus of claim 10, wherein the gap is vertical.

15. The apparatus of claim 10, wherein portions of the annular cover on either side of the gap touch.

16. The apparatus of claim 10, wherein the annular cover comprises alumina.

17. An apparatus for thermally treating a substrate, comprising:
a substrate support;
a magnetically permeable ring below the substrate support; and
an annular cover over the magnetically permeable ring, wherein the annular cover has a gap, wherein the gap is a slice through a portion of the annular cover.

18. An apparatus for thermally treating a substrate, comprising:
a substrate support;
a magnetically permeable ring below the substrate support; and
an annular cover over the magnetically permeable ring, wherein the annular cover has a gap, wherein the gap comprises an open space between two portions of the annular cover at ambient conditions.

19. The apparatus of claim 18, wherein the open space measures less than about 0.05 inches.

20. A shield member for a thermal treatment chamber, comprising a ceramic ring-like article with a support ledge formed in an outer portion, a shield extension formed in an inner portion, and a gap, wherein the gap is a vertical opening in a portion of the ceramic ring-like article comprising an open space measuring less than about 0.05 inches between two portions of the ceramic ring-like article.

* * * * *